(12) United States Patent
Oberlaender et al.

(10) Patent No.: US 7,821,849 B2
(45) Date of Patent: Oct. 26, 2010

(54) CONFIGURABLE EMBEDDED PROCESSOR

(75) Inventors: Klaus J. Oberlaender, Neubiberg (DE); Ralph Haines, Atherton, CA (US); Eric Chesters, Mountain View, CA (US); Dirk Behrens, Burgwedel-Wettmar (DE)

(73) Assignee: Infineon Technologies AG, Neubiberg (DE)

( * ) Notice: Subject to any disclaimer, the term of this patent is extended or adjusted under 35 U.S.C. 154(b) by 329 days.

(21) Appl. No.: 12/028,302

(22) Filed: Feb. 8, 2008

(65) Prior Publication Data

US 2008/0195835 A1 Aug. 14, 2008

Related U.S. Application Data

(63) Continuation of application No. 10/848,997, filed on May 18, 2004, now Pat. No. 7,339,837.

(51) Int. Cl.
*G11C 7/10* (2006.01)
(52) U.S. Cl. .............. 365/189.08; 365/63; 365/51; 365/189.03
(58) Field of Classification Search ............ 365/189.08, 365/63, 51
See application file for complete search history.

(56) References Cited

U.S. PATENT DOCUMENTS

| | | | |
|---|---|---|---|
| 4,281,392 A | | 7/1981 | Grants et al. |
| 4,571,676 A | | 2/1986 | Mantellina et al. |
| 4,787,060 A | | 11/1988 | Boudreau et al. |
| 5,237,674 A | * | 8/1993 | Mohme et al. ............... 711/115 |
| 5,446,860 A | * | 8/1995 | Dresser et al. .............. 711/100 |
| 5,515,532 A | | 5/1996 | Iijima |
| 5,524,232 A | | 6/1996 | Hajeer |
| 5,715,430 A | * | 2/1998 | Hirayama ................. 711/141 |
| 5,790,890 A | | 8/1998 | Mirov et al. |
| 5,860,134 A | * | 1/1999 | Cowell ..................... 711/172 |
| 5,862,320 A | * | 1/1999 | Nelsen et al. ................ 714/42 |
| 5,999,468 A | * | 12/1999 | Lawrence ................... 365/201 |
| 6,003,110 A | * | 12/1999 | Brandt et al. ................ 711/5 |
| 6,092,146 A | * | 7/2000 | Dell et al. ................. 711/5 |
| 6,170,035 B1 | | 1/2001 | Gianellini et al. |
| 6,226,729 B1 | | 5/2001 | Stevens et al. |
| 6,275,434 B1 | | 8/2001 | Yamada et al. |
| 6,349,362 B2 | | 2/2002 | Luick |
| 6,366,985 B1 | | 4/2002 | Beyerlein et al. |
| 6,411,561 B2 | | 6/2002 | Ayukawa et al. |
| 6,412,038 B1 | | 6/2002 | Mehalel et al. |
| 6,463,550 B1 | * | 10/2002 | Cepulis et al. ............... 714/25 |
| 6,473,835 B2 | | 10/2002 | Luick |
| 6,499,093 B2 | * | 12/2002 | Mann ....................... 711/167 |
| 6,625,692 B1 | * | 9/2003 | Stubbs et al. ............... 711/115 |
| 6,744,437 B2 | | 6/2004 | Yamagishi et al. |

(Continued)

FOREIGN PATENT DOCUMENTS

EP 0261030 A2 3/1988

(Continued)

*Primary Examiner*—Viet Q Nguyen
(74) *Attorney, Agent, or Firm*—Dickstein Shapiro LLP (57) ABSTRACT

A configurable processor architecture uses a common simulation database for multiple processor configurations to reduce the cost of producing customized processor configurations. An unchanging core portion is used in each processor configuration. To support different memory modules, identification signals are provided from the memory modules or an identification module to configure the core portion.

30 Claims, 7 Drawing Sheets

U.S. PATENT DOCUMENTS

| | | | |
|---|---|---|---|
| 6,751,740 B1 * | 6/2004 | Robertson et al. | 713/300 |
| 6,772,328 B1 * | 8/2004 | Talbot et al. | 713/1 |
| 6,801,459 B2 * | 10/2004 | Riesenman et al. | 365/189.16 |
| 6,819,598 B2 | 11/2004 | Yamazaki et al. | |
| 6,959,376 B1 | 10/2005 | Boike et al. | |
| 7,032,158 B2 | 4/2006 | Alvarez et al. | |
| 7,155,627 B2 * | 12/2006 | Matsui | 713/401 |
| 7,174,415 B2 * | 2/2007 | Ironi et al. | 711/5 |
| 7,200,770 B2 * | 4/2007 | Hartwell et al. | 714/7 |
| 7,260,671 B2 * | 8/2007 | Cordes et al. | 711/103 |
| 7,339,837 B2 * | 3/2008 | Oberlaender et al. | 365/189.08 |
| 2003/0226055 A1 | 12/2003 | Yoshitake | |
| 2004/0125658 A1 | 7/2004 | Yamazaki et al. | |
| 2005/0004556 A1 | 1/2005 | Pursley | |
| 2005/0248365 A1 | 11/2005 | Chang | |

FOREIGN PATENT DOCUMENTS

| | | |
|---|---|---|
| JP | 405151070 A | 6/1993 |
| JP | 408022412 A | 1/1996 |

* cited by examiner

CONFIGURABLE EMBEDDED PROCESSOR

FIELD OF THE INVENTION

The present invention relates to microprocessors, and more particularly to methods for designing, testing, and building configurable embedded processors and the architecture of configurable embedded processors.

BACKGROUND OF THE INVENTION

Modern electronic systems are increasingly using microprocessors to provide greater flexibility and functionality. For example, many home entertainment components such as DVD players include microprocessors to perform video decompression. Computer peripherals such as laser printers, modems, and disk drives also include microprocessors to perform various functions. In the past many of these devices used microprocessors on circuit boards. The circuit boards would include support chips for the microprocessor such as memory, as well as chips to perform the functions of the overall device.

Advances in silicon processing techniques have allowed creation of systems, which include the microprocessor and the support logic, and memory, on a single chip. Further integration also allows systems on a chip that include additional logic functions with the microprocessor and support logic on a single chip. These microprocessors, which are "embedded" within the system, are generally referred to as embedded processors.

Because designing, verifying, laying out (the process of deciding how the various components of the processor are physically placed on a chip), producing and testing processors, including microprocessors, microcontrollers, and embedded processors are so difficult, most users purchase the microprocessors from a handful of processor companies that have expertise in designing, verifying, laying out, producing and testing processors. As used herein, simulating and simulation refers to verifying the design of the microprocessor. Conversely, testing refers to insuring a specific instance of a produced microprocessor, i.e. the semiconductor device itself functions properly.

Different users may have vastly different requirements for microprocessors, especially in the market for embedded processors. For example, different users may have different requirements for caching, memory, and memory management. Providing a small number of configurations of a processor risks losing potential users who may turn to other sources for a processor that more closely matches the user's requirements. However, providing a custom processor configuration for each user would require vast resource to design and simulate each custom configuration. Specifically, conventional approaches to processor design would require separate design databases and simulation databases for each processor configuration. Then the difficult task of laying out each processor configuration must be performed. Furthermore, the various databases associated with each configuration must be properly maintained. After production of the processor, each processor must be individually tested. Different testing procedures must be developed for each processor configuration. For example, each processor configuration is likely to require different test vector patterns. However, generation of test vectors even using automatic test pattern generation (ATPG) is very time consuming and expensive. To make a profit on the processors, processor companies could only expend the resources required for a custom processor for a limited number of processor configurations. Thus, potential users of a processor may still be forced to use products from other processor companies.

Hence there is a need for a method or system to provide multiple processor configurations with minimal resources required for designing, simulating, and testing of different processor configurations.

SUMMARY

Accordingly, a configurable processor architecture in accordance with one embodiment of the present invention uses a single design file that contains multiple processor configurations. The configurable processor architecture makes use of a modular approach that allows various modules to be swapped in or out for different processor configurations. The configurable processor architecture includes a core portion that contains the main processing elements that are contained in all the processor configuration. Because memory modules can vary in size between configurations the core portion is created to be able to support all the possible sizes of memory modules. To ensure proper function, identification signals, which provide the memory size as well as other memory information, are used to configure the core portion to support the actual memory modules in the integrated circuit. The identification signals can be driven directly by the memory modules or an identification module.

Different support modules can be selected in various processor configurations. For example, some processor configurations would include data cache tag sections, program cache tag sections, memory management units, or coprocessors. In some embodiments of the present invention, a support module can include a functional unit, a termination unit, or a manufacturing test unit depending on the specific processor configuration.

The present invention will be more fully understood in view of the following description and drawings.

DETAILED DESCRIPTION

As explained above, different users may require embedded processors to be configured with differing amounts of cache, memory, and other support circuits such as a memory management unit, or a co-processor. Conventional methods required separate design databases for each processor configuration. Furthermore, separate simulation databases, test vector sets, and netlists had to be generated for each processor configuration. In addition, errors found during simulation of one configuration may or may not be applicable to other configurations thus each configuration must be separately debugged.

Figure 1:
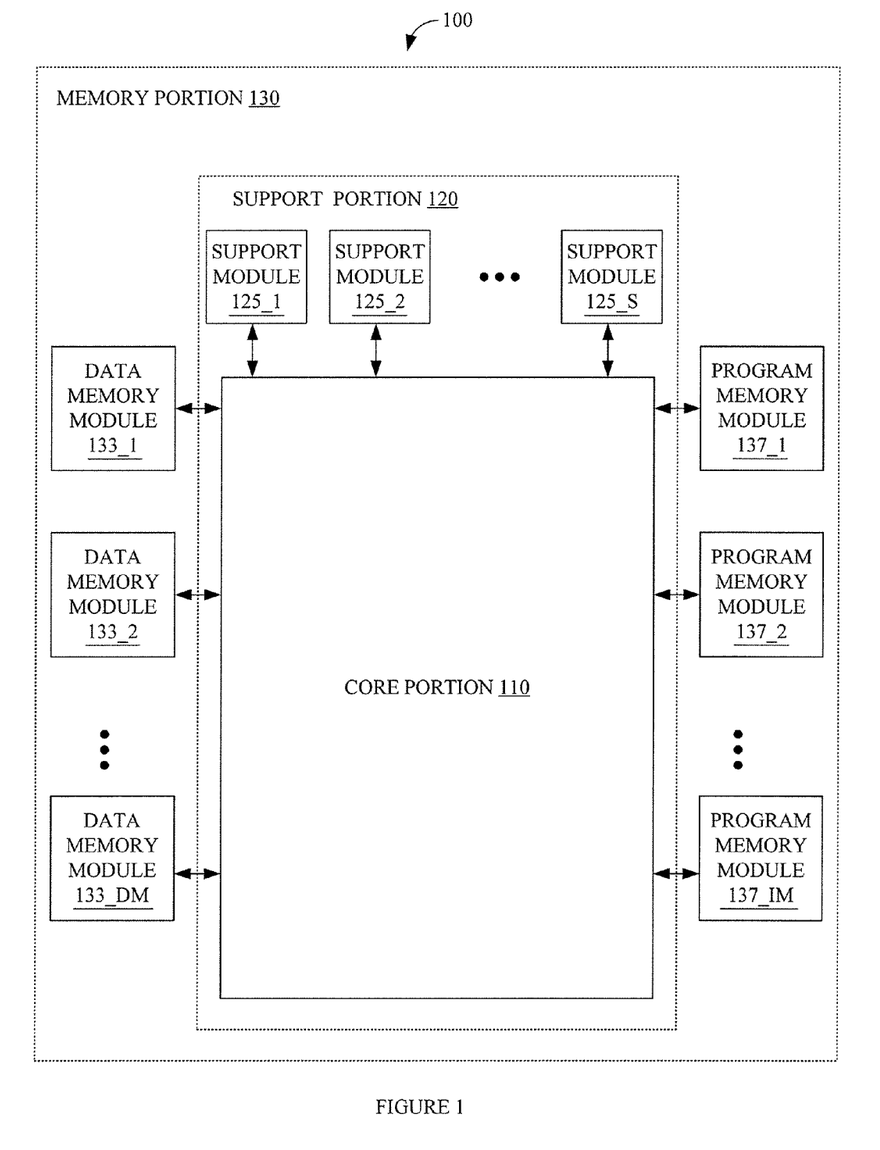
FIG. 1 is simplified block diagram of a configurable processor architecture in accordance with one embodiment of the present invention.

The present invention uses a novel processor architecture that allows novel simulation and testing methods to easily simulate multiple processor configurations. Furthermore, testing of processors of different processor configurations can be greatly simplified by sharing many test parameters. FIG. 1 is a simplified block diagram of a configurable processor architecture 100 in accordance with one embodiment of the present invention. Configurable processor architecture 100 is conceptually divided into three portions: a core portion 110, a support portion 120, and a memory portion 130. Core portion 110 includes the main processing elements such as the arithmetic logic unit (ALU), the integer pipeline, load/store pipeline and memory interfaces. Some embodiments of the present invention also include clock trees in the core portion. In general, core portion 110 includes elements that are present in every processor configuration of configurable processor architecture 100. Furthermore, core portion 110 includes the most complicated blocks of configurable processor architecture 100. Thus, core portion 110 is likely to be the most difficult to debug and to layout. However, once debugged and laid out, core portion 110 is used in all the different processor configurations. Thus, no additional debugging should be needed for different processor configurations. Furthermore, by keeping the layout of core portion 110 the same (and separate from other functions) in all processor configurations layout time is greatly reduced. In addition the modular approach allows reuse of many of the same modules while verifying and testing individual processors across different processor configurations.

Support logic portion 120 includes core portion 110 and various configurable support modules such as support module 125_1, 125_2, . . . 125_S. Examples of support modules include memory management modules, data caches, and program caches, co-processors (e.g. floating point co-processors), and bus interfaces. For example in a specific embodiment of the present invention, support portion 120 includes two data cache tag portions, a program cache tag portion, and a memory management module. As explained in more detail below, each support module can be configured in a variety of ways to provide different processor configurations. For example, the caches can vary in size and the memory management module may or may not contain a memory manage unit. Memory portion 130 includes support portion 120 and various configurable memory modules, such as data memory modules 133_1, 133_2, . . . 133_DM, and program memory modules 137_1, 137_2, . . . 133_IM. In a specific embodiment of the present invention, configurable processor architecture 100 includes 8 data memory modules and 8 program memory modules. The size of the data memory modules can be configured independently of the size of the program memory modules to provide different processor configurations of processor 100.

As explained above, one of the primary problems of supporting customized embedded processors is the amount of time and other resources required to design and simulate each processor configuration. Furthermore, after manufacturing each processor must be independently tested. Thus, testing paradigms, e.g. test patterns generated by ATPG, must be developed for each processor configuration. In addition, the test patterns for each processor configuration must be simulated with the corresponding process configuration to ensure that the test patterns are accurate for the corresponding configuration. The present invention greatly reduces the number of simulation file needed for verifying multiple processor configurations of a configurable processor architecture. For clarity, as used herein, a configurable processor architecture refers to a generalized architecture that can be configured into multiple individual processor configurations. The top level netlist of a configurable processor architecture is identical across all the processor configurations. Thus, all processor configurations of a configurable processor architecture would include the same number of modules. However, each module in the top level netlist can be configured differently in different processor configurations. Furthermore, some modules may be simple termination modules in a specific processor configuration. For example, if a support module represents a memory management module, the two optional configurations for that module may be to include a memory management unit or to include a termination unit that has the same interface as the memory management unit but does not perform the functions of the memory management unit. Furthermore, to simplify testing of the manufactured processors the termination unit would be configured to be as similar to the memory management unit from a testing perspective as possible.

To insure that core portion 110 functions properly with the various configuration of support modules and memory modules, core portion is configured by identification signals from the various modules. For example, the identification signals of memory modules may indicate the size of the memory modules. Similarly, support modules for caches may also include size information in the identification signals. Other modules may include a simple signal indicating whether module is a functioning module or a termination module. Thus, for example a memory module, which has 8 configurable sizes would send at least three binary identification signals to core portion 110 to indicate which of the 8 memory sizes is being used. Additional identification signals may also be included for other configurable options. The identification signals configures core portion 110 (which can support any of the memory configuration) to function appropriately with the specific memory module.

Figure 2:
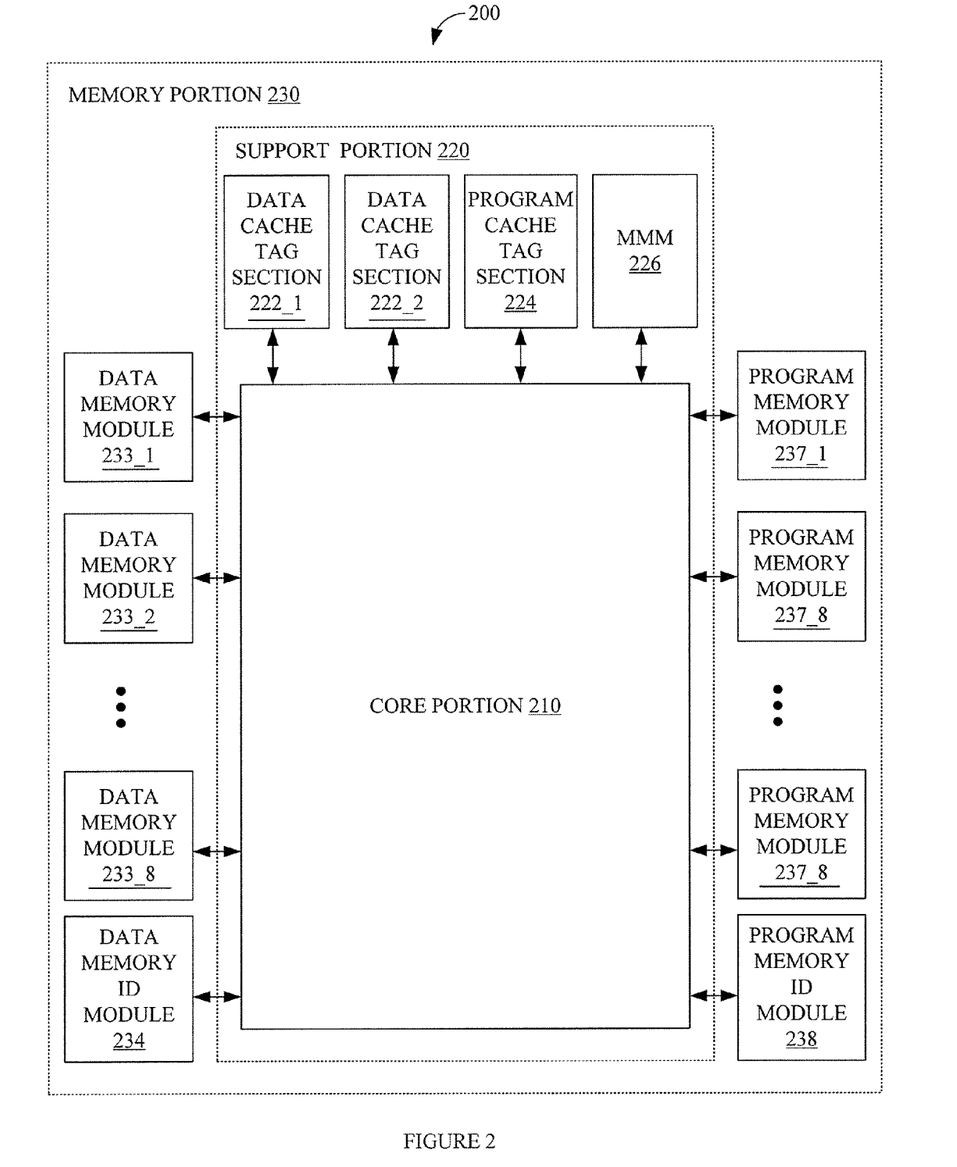
FIG. 2 is simplified block diagram of a configurable processor architecture in accordance with one embodiment of the present invention.

The principles of the present invention can be used with a variety of different processor architectures. However for clarity, only one configurable processor architecture is described in detail. Specifically, FIG. 2 shows a configurable processor architecture 200, which includes core portion 210, support portion 220, and memory portion 230. The support modules of support portion 220 are a data cache tag section 222_1, a data cache tag section 222_2, a program cache tag section 224, and a memory management module (MMM) 226. Memory portion 230 includes 8 data memory modules 233_1, 233_2, . . . 233_8, a data memory identification (ID) module 234, 8 program memory modules 237_1, 237_2, . . . 237_8, and a program memory identification (ID) module 238.

In configurable processor architecture 200, support portion 220 can be configured with 4 different data cache sizes, 4 different program cache sizes, and 2 different memory management states. Specifically, data cache tag section 222_1 and 222_2, which are the same size, can be configured to be one of four different sizes. The four sizes correspond to 0 i.e. only a termination module, one-fourth, one-half, and full size. Full size can be for example 16 kilobytes (KB). Similarly, program cache tag section 224 can be configured to be one of four different sizes. The same cache tag section design can be used for data cache tag section 222_1, data cache tag section 222_2, and program cache tag section 224. Configurable processor architecture 200 uses a shared memory model between the cache and main memory. Specifically, memory modules (as described below) are partitioned for both main memory and cache memory. However, cache tags are stored separately. Thus only the tags are stored within data cache tag section 222_1, data cache tag section 222_2, and program cache tag section 224. Other embodiments of the present invention may include actual cache memory in support portion 220 rather than using a shared memory model.

A shared memory model provides some benefits and problems with regards to a configurable processor architecture. While the core portion must treat the memory differently based on the amount of cache, the design, simulation, layout, and testing of the memory modules can be performed independently of the cache size. Some embodiments of the present invention allow the cache size to be software adjustable. For example, data cache tag section 222_1 may be configured to use the maximum amount of cache. However, another register can be included that overrides the size of the cache used by core portion 210. Specifically, core portion 210 can ignore the high address bit from data cache tag section 222_1 to effectively use a smaller cache in the memory modules. In addition the core portion would need to ignore the high address bit for the memory modules for caching and start the main memory portion of the memory module at a lower address bit.

Memory management module 226 can be configured to one of 2 states: memory management or no memory management. When memory management module 226 is configured for memory management, memory management module 226 would include memory management unit. When memory management module 226 is configured to no memory management, memory management module 226 would omit the memory management unit. Support portion 220 can have 32 (4 times 4 times 2) different configurations.

In configurable processor architecture 200, standard memory modules are used. These standard memory modules do not include circuits to provide identification signals to core portion 210. Thus, data memory identification (ID) module 234 is included to provide identification signals indicating the memory size of data memory modules 233_1, 233_2, . . . 233_8 to core portion 210. In configurable processor architecture 200, the data memory modules, which are the same size, can be one of eight different sizes. Specifically, a data memory module can be configured to be 64 KB, 56 KB, 48 KB, 40 KB, 32 KB, 24 KB, 16 KB, or 8 KB. Although the size of the memory module can change between different processor configuration, the interface between the memory modules and the core portion remain the same both functionally and physically. In addition the placement of the interface between the memory module and the core portion retains the same location in the floorplan of the processor regardless of the size of the memory modules. By maintaining the same logical and physical interface, different size memory modules can be interchangeable. Thus, the memory modules have the same data bus and address bus. However for memory modules having less memory, the high order address bits are ignored. Data memory identification (ID) module 234 is configured to drive three identification signals (not shown), which indicates which of the eight memory sizes is being used, to core portion 210. Similarly, program memory identification (ID) module 238 is included to provide the memory size used by program memory modules 237_1, 237_2, 237_8. The program memory modules can be one of eight memory sizes. Thus, total number of processor configurations supported by configurable processor architecture 200 is 2048. Specifically, there is an option for 8 different data memory size, 8 different program memory size, 4 different data cache tag sizes, 4 different program cache tag sizes, and 2 options for the memory management module 226.

Other embodiments of the present invention may have even more processor configurations. For example some embodiments of the present invention would include additional support modules or additional memory modules. For example, some embodiments of the present invention may include coprocessor modules, floating point units, or bus modules to connect to other devices. Furthermore, these modules may have additional options. For example, in some embodiments of the present invention, each memory modules can be a different size. In these embodiments the memory identification modules would provide a set of identification signals for each data memory module. In addition some embodiments of the present invention may allow other configuration options in the memory modules. For example, in some embodiments of the present invention, memory modules may allow different memory types (e.g., synchronous DRAMS, double-data rate DRAMS) and different memory speed. IF these other options are included, the data memory identification module would provide additional identification signals to core portion 210. Alternatively, if the memory modules are custom made for a configurable processor architecture the memory modules can be designed to provide the necessary identification signals.

Figure 3:
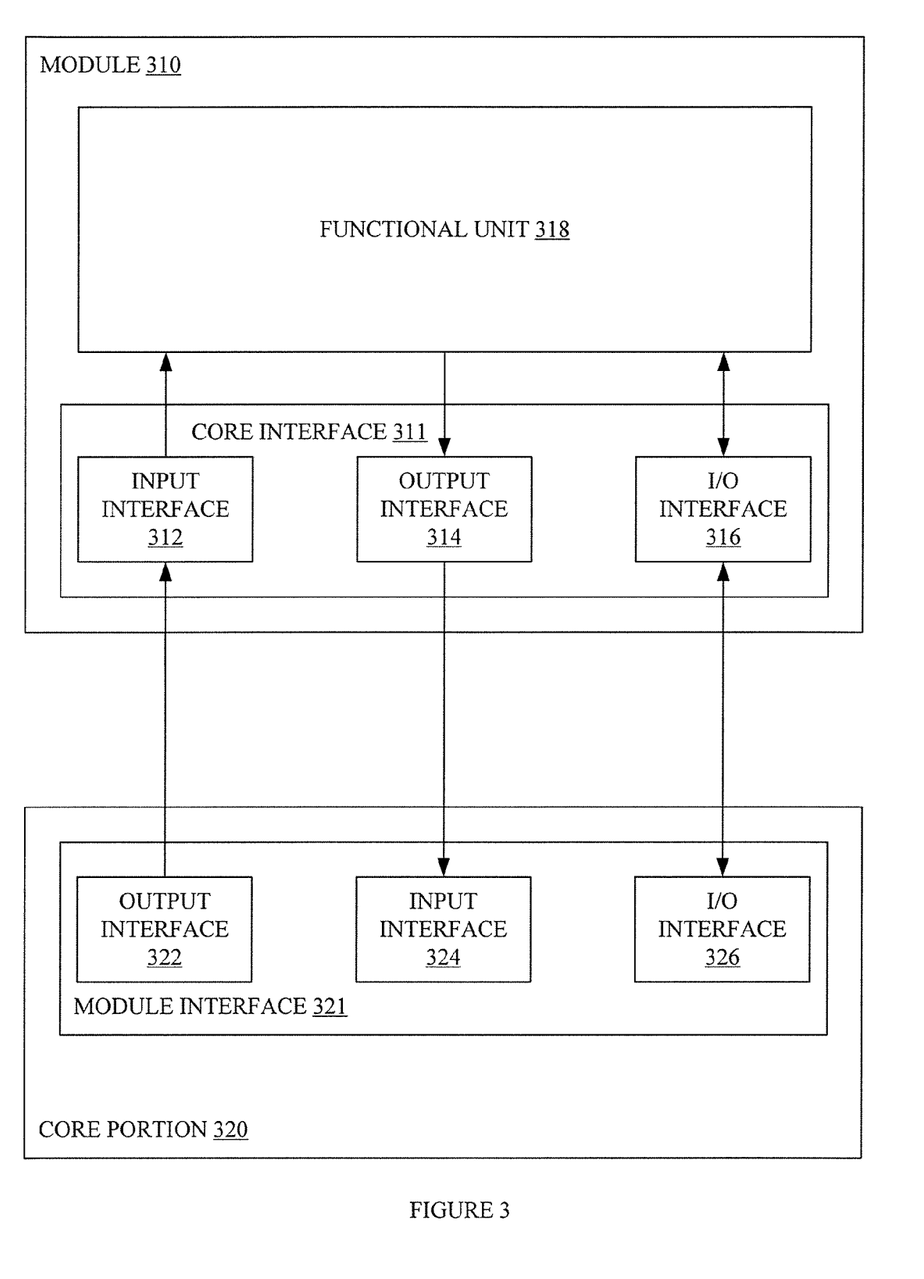
FIG. 3 is a simplified block diagram of the interface between a module and a core portion in accordance with one embodiment of the present invention.

FIG. 3 illustrates the interface between a module 310 and a core portion 320. Module 310 includes a core interface 311, which is conceptually divided into an input interface 312, an output interface 314, an input/output (I/O) interface 316, and a functional unit 318. Core portion 320 includes a module interface 321, which is conceptually divided into an output interface 322, an input interface 324, and an input/output interface 326. Core portion 320 would include a module interface for each module in the support portion and each module in the memory portion of the configurable processor architecture. In addition core portion 320 would include the processing elements (not shown) as described above. Control and/or data signals from core portion 320 are sent to module 310 from output interface 322 to input interface 312 of module 310. Conversely, control and/or data signals from module 310 are sent to core portion 320 from output interface 314 to input interface 324 of core portion 320. The module identification signals described above are also transferred from output interface 314 to input interface 324. Furthermore, bi-directional signals of module 310 and core portion 320 are transferred between input/output interface 318 of module 310 and input/output interface 328 of core portion 320. The physical layout, including the width of the module and the position and order of the interface signals, of core interface 311 should not change between different configurations of module 310. Thus, for example, the functionality and the physical layout of core interface 311 is the same whether module 310 is a 8 KB memory module or a 64 KB memory module. However, the core interface need not be identical in different types of modules. For example, the core interface of a memory module need not be the same as the core interface of support module.

Functional unit 318 performs the actual function required of module 310. For example, if module 310 were a memory module, functional unit 318 would include the memory array and necessary control logic. Depending on the configuration of the memory module, functional unit 318 would vary in size with changes in the memory size. In configurable processor architecture 200, data memory modules 233_1, . . . 233_8 are designed so that the memory arrays expand in a single direction away from core portion 210. Similarly, program memory modules 237_1, . . . 237_8 are also designed so that the memory arrays expand away from core portion 210. In this manner, the vertical size of each processor configuration of configurable processor architecture 200 remains relatively constant.

If module 310 represents memory management module 226, functional unit 318 would be a memory management unit in processor configurations supporting the memory management functions. In a processor configuration of configurable processor architecture 200 that do not support memory management, memory management module 226 could omit functional unit 318. However, module interface 311 would remain to provide the identification signals as well as to prevent output signals from module 310 from floating to an indeterminate state.

If module 310 represents a cache tag section, such as program cache tag section 224 or data cache tag section 222_1 or 222_2, functional unit 318 would perform the caching functions. If a particular processor configuration does not require caching, functional unit 318 can be omitted. By having different configurations perform identically, different test patterns are not required for each configuration.

However in some embodiments of the present invention, when a processor configuration does not require a particular module, functional unit 318 of the module is replaced with a manufacturing test unit (not shown). A manufacturing test unit behaves the same as the functional unit during manufacturing tests but otherwise would not provide the functionality (or complexity) of the functional unit. For example, in one embodiment of the present invention, all tag modules regardless of size are configured to perform identically under manufacturing test. When a particular processor configuration does not require a tag module, a manufacturing test unit, that behaves like the functional unit during manufacturing test, is used in place of the functional unit of the tag module. Memory modules are well suited to this method of testing because memory built in self tests (MBIST) can be used to actually test the memory. Thus, the memory module requires little or no testing with test vectors generated by ATPG. Therefore, a manufacturing test unit can easily be made to mimic the actual functional unit during testing. However for some modules, such as the memory management unit, creating manufacturing test units would be very difficult because the functional logic of the modules requires testing by the use of test vectors.

As explained above, a major issue with conventional processor architectures is the need to create a design database for each processor configuration. Then, a simulation database must be created for each design database. Furthermore, a test paradigm must be developed for each processor configuration so that each instance of a processor can be tested. However, using the principles of the present invention, a design database with a single simulation database is used for multiple processor configurations. Generally, a single simulation database can be used for every processor configuration of a configurable processor architecture. A single simulation database can be used for multiple processor configuration when the top level netlist of each processor configuration is identical. As explained above, in accordance with the present invention, each processor configuration of a configurable processor architecture includes the same core portion as well as the same number of modules in the support portion and the memory portion. Furthermore, the interconnection between the modules and the core portion are also identical. Thus, all processor configurations of a configurable processor architecture in accordance with the present invention can be housed in a single simulation database. In addition, each module is configured to give identification signals to the core portion so that the core portion functions properly with the modules and the core portion can use the available features of the modules. The identification signals can come directly from a module or from a corresponding identification module, which is used in conjunction with some modules.

A simulation database written using virtual hardware definition language (VHDL) can be configured using generics at the top level to configure the optional features of each module. Generics can be used to control the optional features of the module even after compilation of the simulation database into a binary file. Unfortunately, Verilog, a popular competing hardware definition language, does not have similar features to allow configuration after creation of the binary file. However, Verilog does allow the use of compiling parameters, which can be used to configure the optional features of the modules. Thus with Verilog, a single simulation database can be used for all the processor configurations but each processor configuration would have its own binary file.

Figure 4A:
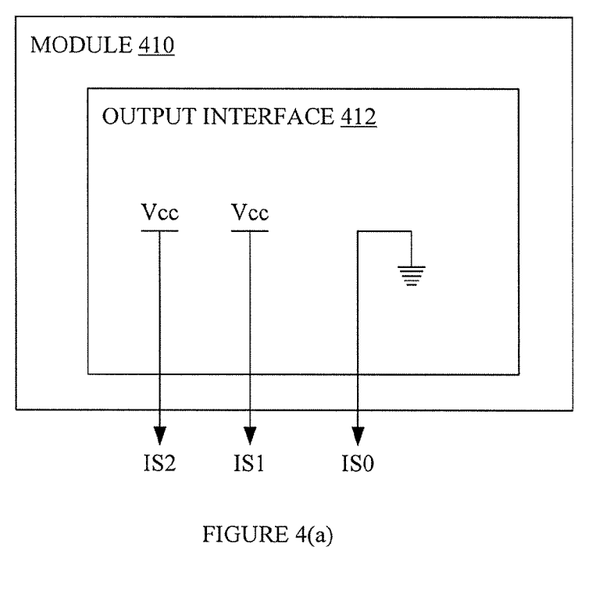
FIGS. 4(a) and 4(b) are simplified block diagrams of output interfaces in accordance with one embodiment of the present invention.

To maintain the same top level netlist and provide easier testing, special care must be taken to insure that automatic optimization tools do not remove "unnecessary" circuits in the modules. FIG. 4(a) illustrates this potential problem. Specifically, FIG. 4(a) illustrates an output interface 412 of a module 410. Output interface 412 provides identification signals on identification lines IS2, IS1, and IS0. To avoid confusion, signal names use the same reference names as the lines carrying the signals. Thus, identification signals IS2, IS1, and IS0 are carried on identification lines IS2, IS1, and IS0, respectively. Output interface 412 ties identification lines IS2 and IS1 to the positive supply voltage and ties identification line IS1 to ground. Thus, identification signals IS2, IS1, and IS0 are logic 1, logic 1, and logic 0, respectively. However, automatic optimization tools, may remove identification lines IS2, IS1, and IS0 because they are hardwired to a specific value, which can be provided in the core portion rather than from module 410. Generally, the design tools used in semiconductor design provides methods to protect specific circuits from optimization. These methods should be used to insure the identification lines are not removed.

Figure 4B:
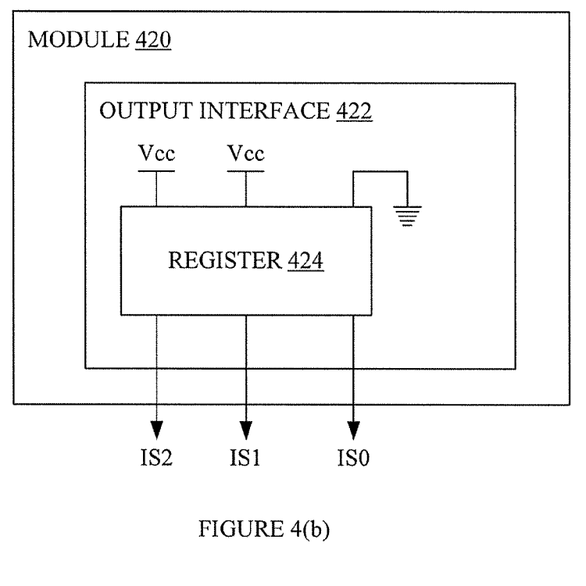

As illustrated in FIG. 4(b), in some embodiments of the present invention, a module 420 with an output interface 422 includes a register 424, which drives identification lines IS2, IS1, and ISO. Using registers to drive identification signals also provides some benefits during simulation. Specifically, during simulation, the simulation software can read and write each register within the simulated semiconductor device. Thus, the simulation software can be configured to read the various registers providing the identification signals to core portion 110 and modify the simulation scheme based on the processor configuration. Therefore, a single simulation database could be created for use with all the processor configurations. Some embodiments of the present invention includes a register in the core portion to store all the identification signals from the various modules to facilitate easy access to all the configuration information.

In conventional processor architectures after simulation of the various processor configurations, each processor configuration would need to be laid out. As explained above, laying out a complicated semiconductor device such as a system on a chip is an expensive and time consuming task. However, by using the principles of the present invention, the time and cost of laying out the different processor configurations is greatly reduced. Specifically, by using a modular approach to the processor configurations, layout can be done at the module level rather than at a chip level. Thus, for example, once a layout for core portion 120 (FIG. 1), which is used in all the processor configurations, is generated for one processor configuration, the same layout can be used in other processor configurations. Similarly, layouts for the other modules can be reused as well. Reuse of layouts for a module and the core portion is made possible by having the interfaces between the core portion and the module be identical in all processor configurations, as well as the use of termination units as described above. Reuse of layout can be also be used at the support portion level. For example, if a layout for a support portion has been completed, the same layout can be used with different memory configurations.

Conventionally, clock tree balancing is performed at a chip level. However, with the modular approach of the present invention where layout of modules and core portions are reused, the clock tree must be balanced at a modular level. As explained above in many embodiments of the present invention, clock signals are generated within core portion 110 and provided to each of the support modules and memory modules. To maintain balance, each different configuration of a particular module should present the same load on the clock line from the core portion. One way to keep the same load among the different module configurations is to add buffers on module configurations with small loads so that the overall load is equal to the module configurations with inherently larger loads. For example, a memory module with 32 KB of memory would include additional buffer loads so that the overall load on the clock line would be the same as a memory module with 64 KB. Similarly, support modules may include additional buffer loads to maintain the same overall load over all the module configurations. Furthermore, in some embodiments of the present invention, the loads of other signals in addition to the clock signals are also balanced. In addition, some embodiments of the present invention also provide output drive balancing between different module configurations.

Figure 5A:
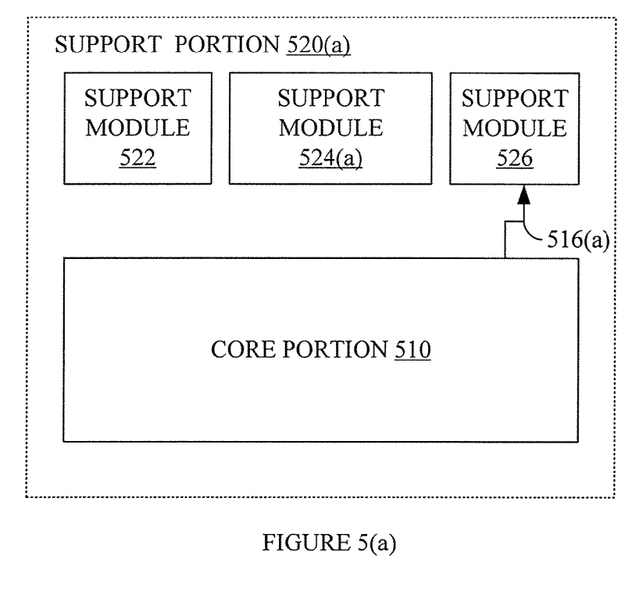
FIGS. 5(a) and 5(b) are simplified block diagrams of a support portion.
Figure 5B:
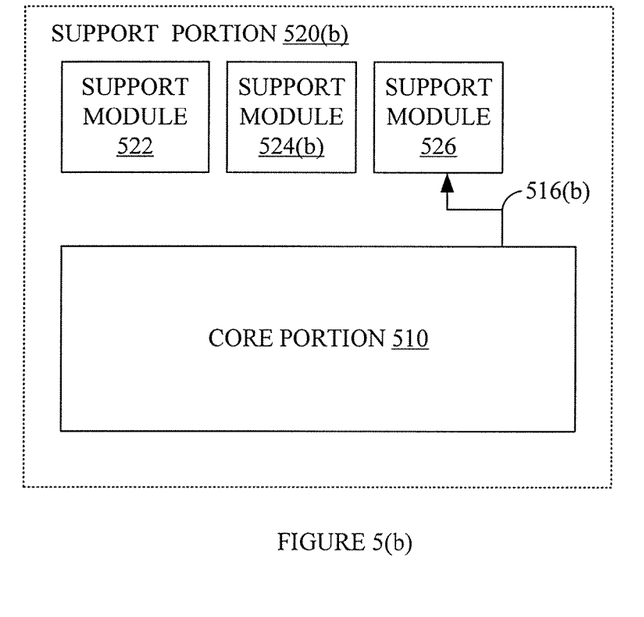

In some embodiments of the present invention, the support modules in support portion 120 (FIG. 1) are shifted depending on the size of the other support modules. This shifting of the support modules may cause unbalancing of clock lines because the line length of the clock lines would vary. FIGS. 5(a) and 5(b) illustrate this potential unbalancing of a clock line between a support module and a core portion. Specifically, as illustrated in FIG. 5(a), a support portion 520(a) includes a core portion 510 and support modules 522, 524(a) and 526. Core portion 510 drives a clock signal on clock line 516(a) to support module 526. For clarity, other connections between the support modules and core portion 510 are omitted. As shown in FIG. 5(b), in a different processor configuration, a support portion 520(b) includes core portion 510, and support modules 522, 524(b) and 526. Core portion 510 drives a clock signal on clock line 516(b) to support module 526. Support module 524(b) is thinner than support module 524(a). Thus, support module 526 is shifted left in support portion 520(b) relative to the position of support module 526 in support portion 520(a). As explained above, core portion 510 is identical throughout the different processor connections, thus clock line 516(a) and 516(b) originate from the same location of core portion 510. Similarly, clock lines 516(a) and 516(b) end at the same place on support module 526. However, since support module 526 is shifted in support portion 520(b) relative to the position of support module 526 in support portion 520(a), clock line 516(a) and 516(b) are of a different length provide different impedance. Thus, the clock line would not be balanced in both support portion 520(a) and support portion 520(b).

Figure 6A:
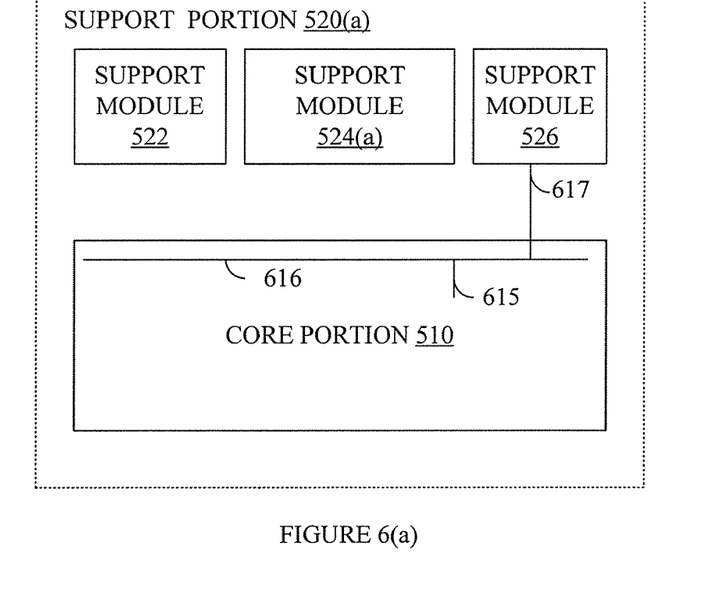
FIGS. 6(a), 6(b), and 6(c) are block diagrams of support portions having clock bars in accordance with one embodiment of the present invention.
Figure 6B:
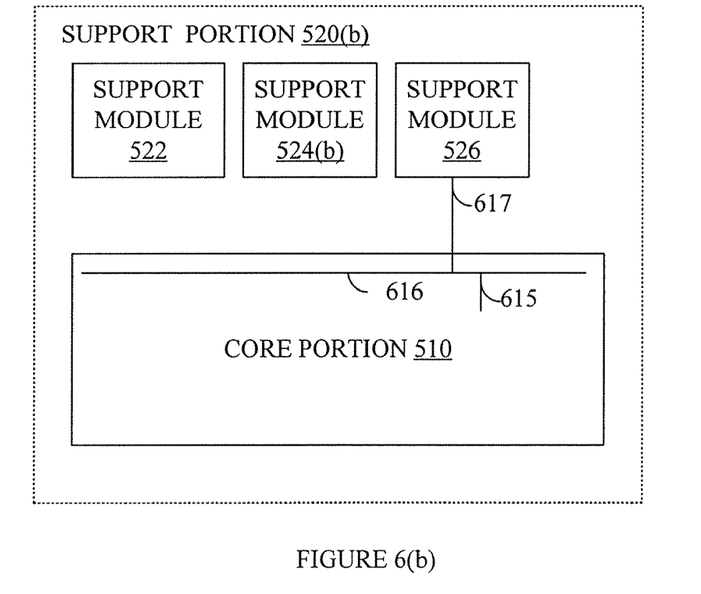
Figure 6C:
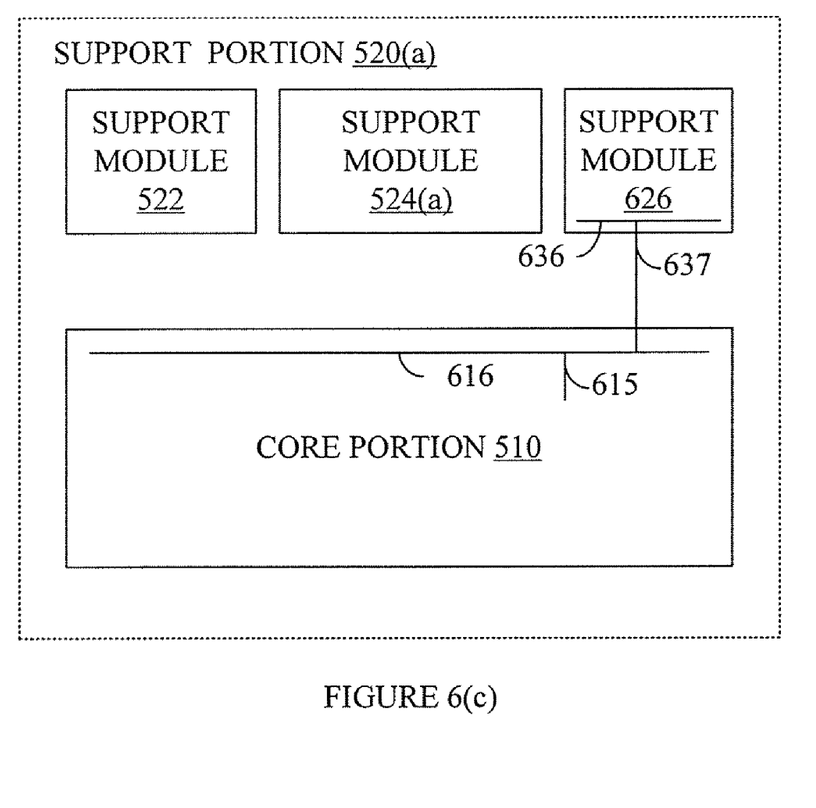

FIGS. 6(a) and 6(b) illustrate an embodiment of the present invention to provide balanced clock lines even if the location of the support modules are shifted. Specifically, a clock bar 616 is used within core portion 510 to provide clock signals from core portion 510 to support module 526. Clock bar 616 is coupled to a clock generation circuit (not shown) by a clock line segment 615. Clock bar 616 is also coupled to support module 526 by a clock line segment 617. As illustrated in FIG. 6(b), as support module 526 is shifted, clock line segment 617 shifts along clock bar 616. Thus, in any processor configuration, the clock signal from core portion 510 to support module 526 would travel on clock line segment 615, clock bar 616, and clock line segment 617. Thus, the load presented to the clock signal is identical for all the different processor configurations. Other support modules can also use clock bars, which were omitted for clarity. In some embodiments of the present invention clock bars are also be added to support modules as illustrated in FIG. 6(c). Specifically, support module 626 includes a clock bar 636. Clock bar 636 is coupled to clock bar 616 of core portion 510 by a clock line segment 637. The endpoints of clock line segment 637 can be coupled to any point on clock bar 636 and clock bar 616. Using a clock bar in the support modules provides flexibility in routing clock line segment 637. Furthermore, a clock bar in the support modules allows the support modules to be shifted over a wider area than embodiments of the present invention that do not use a clock bar in the support modules.

As explained above, after production of each processor chip, each processor chip must undergo a testing process to insure proper functionality of the processor chip. Generally, testing of a semiconductor device is performed using automatic test pattern generation (ATPG) and memory built in self test (MBIST). MBIST is used for any memories on the chip and ATPG is used on the non-memory portions of the chip. To support ATPG the tools used in designing, simulating, and laying out of chips add a design for test (DFT) mode into the chips. In DFT Mode, the testing unit can load each register of the chip, using for example a scan chain, scan inputs, and scan multiplexers. The chip is then clocked for one clock cycle and the testing unit then reads the contents of each register (usually by shifting the response out of the scan chain) to see if the expected value is present in the registers. Automatic test pattern generation generates a set of test vectors and corresponding expected results from each test vector which is loaded into the chip. Ideally, automatic test pattern generation can generate the set of test vectors that can detect any physical error on the chip. In conventional processor architectures, each processor configuration would require a different set of test vectors, which can take several days for each processor configuration. Furthermore, each set of test vectors must be verified with a simulation model of the processor configuration prior to manufacturing. Actual testing of each chip is very time consuming and expensive due to the complexity of the processor. This testing problem is compounded by the different configurations which would require time to reconfigure test equipment for each configuration.

However, using the modular approach of the present invention, test patterns generated by ATPG can be used for testing across different processor configurations. Specifically, some modules can be made independent with respect to ATPG and thus can be tested independently. For examples, memory modules and tag modules, which can be independently tested using memory built in self test (MBIST) can be designed to perform identically under testing with using ATPG techniques. However some modules, such as the memory management unit, are not easily tested without using ATPG. For these modules, multiple sets of test patterns are used depending on the configuration of the module and whether the module is used or not used. However, overall number of test pattern sets is greatly reduced using the principles of the present invention.

Although a single simulation database can be used for the various processor configurations, the complete netlist of each processor configuration are different. To differentiate the different processor configurations, each the complete netlist are given different file names. In accordance with one embodiment of the present invention the names for the complete netlist are in the format ARCHNAME_A_B_C_D_E_F. "ARCHNAME" is simply a name chosen for the configurable processor architecture. A, B, C, D, E, F represent identification values for various modules that are present in the configurable processor architecture. For example, for configurable processor architecture 200 (FIG. 2) the name format would be ARCHNAME_PMEM_DMEM_PTAG_DTAG_MMU. Again, "ARCHNAME" is simply a name chosen for the configurable processor architecture. "PMEM" and "DMEM" refers to the memory size of the program memory modules and data memory modules respectively. Similarly, "PTAG" and "DTAG" refer to the size of the program cache tag section and the size of the data cache tag section, respectively. "MMU" refers to whether the memory management unit is present. Thus, ARCHNAME_7_7_3_3_1 would be the processor configuration with a program memory size of 7, a data memory size of 7, a program cache tag size of 3, a data cache tag size of 3, and a memory management unit. ARCHNAME_7_4_2_1_0 would the processor configuration with a program memory size of 7, a data memory size of 4, a program cache tag size of 2, a data cache tag size of 1, and no memory management unit. However, memory management module 226 would exist as a termination module. Table 1 shows the memory sizes associated with different values for PMEM and DMEM in accordance with one embodiment of the present invention. Table 2 shows the tag sizes associated with different values of PTAG and DTAG in accordance with one embodiment of the present invention.

TABLE 1

| PMEM or DMEM | MEMORY SIZE |
| --- | --- |
| 7 | 64 KB |
| 6 | 56 KB |
| 5 | 48 KB |
| 4 | 40 KB |
| 3 | 32 KB |
| 2 | 24 KB |
| 1 | 16 KB |
| 0 | 8 KB |

TABLE 2

| PTAG or DTAG | TAG SIZE |
| --- | --- |
| 3 | 16 KB |
| 2 | 8 KB |
| 1 | 4 KB |
| 0 | 0 KB |

In the various embodiments of this invention, novel structures and methods have been described to simplify and improve the design, simulation and verification of multiple processor configurations of a configurable processor architecture. For example, the present invention can use a single design databases for multiple processor configurations. Thus, when errors are corrected while simulating or testing one configuration the corrections are automatically carried to other processor configurations. Furthermore, the present invention reduces the chances of making mistakes because the processor core configures itself based in the identification signals from the configurable modules. By using configurable modules within static top level netlist, a single simulation database can be used for multiple processor configurations. The various embodiments of the structures and methods of this invention that are described above are illustrative only of the principles of this invention and are not intended to limit the scope of the invention to the particular embodiments described. For example, in view of this disclosure, those skilled in the art can define other configurable processor architectures, core portions, support portions, memory portions, support modules, memory modules, identification signals, module interfaces, core interfaces, and so forth, and use these alternative features to create a method or system according to the principles of this invention. Thus, the invention is limited only by the following claims.

We claim:

1. A processor comprising:
a core portion; and
a first module embedded in the processor, coupled to the core portion and configured to transmit an identification signal to the core portion,
wherein the core portion is configured by the identification signal to communicate data to and/or from the first module.

2. The processor of claim 1, wherein the first module is a memory module.

3. The processor of claim 2, wherein the identification signal indicates a memory type of the first memory module.

4. The processor of claim 2, wherein the identification signal indicates a memory speed of the first memory module.

5. The processor of claim 2, wherein the identification signal indicates that the memory module is either a functioning module or a termination module.

6. The processor of claim 2, further comprising a second memory module coupled to the core portion.

7. The processor of claim 6, wherein the core portion is further configured by the identification signal to communicate data to and/or from the second memory module.

8. The processor of claim 6, wherein at least one of the first and second memory modules has an adjustable memory size.

9. The processor of claim 1, wherein the at least one of the first and second memory modules comprises a memory array, which can be physically expanded in a direction away from the core portion.

10. The processor of claim 1, wherein the core portion comprises a module interface coupled to a core interface of the first module.

11. The processor of claim 10, wherein the module interface and the core interface have a predefined physical position, which is not altered by the configuration of the core portion.

12. The processor of claim 10, wherein the module interface and the core interface have a predefined communication protocol, which is not altered by the configuration of the core portion.

13. The processor of claim 1, wherein the first module is a support module comprising a functional unit.

14. The processor of claim 13, wherein the identification signal indicates to the core portion that the functional unit is selected from the group consisting of:
a) a memory management unit;
b) a program cache tag section;
c) a co-processor;
d) a bus interface; and
e) a floating-point unit.

15. The processor of claim 13, wherein the functional unit is omitted when the specified configuration of the core portion does not require data communication with the support module.

16. The processor of claim 13, wherein the identification signal indicates that the support module is a data cache tag section.

17. The processor of claim 16, wherein the data cache tag section has an adjustable cache size, which is set by software executed by the core portion.

18. A processor comprising:
a core portion;
a plurality of memory modules embedded in the processor and coupled to the core portion, wherein at least one of the plurality of memory modules is configured to transmit a first identification signal to the core portion; and
a plurality of support modules embedded in the processor and coupled to the core portion, wherein at least one of the plurality of support modules is configured to transmit a second identification signal to the core portion,
wherein the core portion is configured by the first and second identification signals to communicate data to and/or from the plurality of memory modules and the plurality of support modules, respectively.

19. The processor of claim 18, wherein the first identification signal indicates to the core portion the memory type of each of the plurality of memory modules.

20. The processor of claim 18, wherein the first identification signal indicates to the core portion the memory speed of each of the plurality of memory modules.

21. The processor of claim 18, wherein the first identification signal indicates that each of the memory modules is either a functioning module or a termination module.

22. The processor of claim 18, wherein the second identification signal indicates to the core portion that each of the plurality of support modules comprises respective functional units, which are selected from the group consisting of:
a) a memory management unit;
b) a program cache tag section;
c) a data cache tag section;
d) a co-processor;
e) a bus interface; and
f) a floating-point unit.

23. A method of generating a processor, the method comprising:
placing a core portion in the processor;
placing a first module in the processor;
providing a plurality of identification lines to couple the core portion to the first module;
transmitting an identification signal from the first module to the core portion, via at least one of the plurality of identification lines; and
configuring the core portion, by the identification signal, to communicate data to and/or from the first module.

24. The method of claim 23, wherein the first module is a memory module.

25. The method of claim 24, further comprising indicating to the core portion, via the identification signal, at least one of the memory speed and memory type of the memory module.

26. The method of claim 24, further comprising placing at least one second memory module.

27. The method of claim 26, further comprising configuring the core portion, by the identification signal, to communicate data to and/or from the at least one second memory module.

28. The method of claim 23, wherein the first module is a support module comprising a functional unit.

29. The method of claim 28, further comprising indicating to the core portion, via the identification signal, that the functional unit is a functional unit selected from the group consisting of:
a) a memory management unit;
b) a program cache tag section;
c) a data cache tag section;
d) a co-processor;
e) a bus interface; and
f) a floating-point unit.

30. The method of claim 28, further comprising omitting the functional unit when the specified configuration of the core portion does not require data communication with the support module.

* * * * *